United States Patent [19]  
Ienaka et al.

[11] 4,276,442  
[45] Jun. 30, 1981

[54] PROTECTIVE CIRCUIT

[75] Inventors: Masanori Ienaka; Masahiro Yamamura, both of Kodaira; Kazuo Watanabe; Yasuo Kominami, both of Kokubunji, all of Japan

[73] Assignee: Hitachi, Ltd., Tokyo, Japan

[21] Appl. No.: 25,039

[22] Filed: Mar. 29, 1979

[30] Foreign Application Priority Data

Apr. 21, 1978 [JP] Japan .................................. 53-46536  
Mar. 22, 1979 [JP] Japan .................................. 54-32291

[51] Int. Cl.³ .......................... H02H 3/14; H02H 7/20
[52] U.S. Cl. ................................ 179/1 A; 330/207 P; 361/88
[58] Field of Search ............... 330/207 A, 207 P, 298; 179/1 A, 1 SW; 361/88

[56] References Cited  
U.S. PATENT DOCUMENTS

| | | | |
|---|---|---|---|
| 3,691,427 | 9/1972 | Honda et al. | 330/207 P |
| 3,727,107 | 4/1973 | Fujie et al. | 330/207 P |
| 3,898,532 | 8/1975 | Frank | 330/207 P |
| 3,965,295 | 6/1976 | Evans et al. | 179/1 A |
| 3,990,019 | 11/1976 | Crockett et al. | 330/207 P |
| 3,992,678 | 11/1976 | Suzuki | 330/207 P |
| 4,034,268 | 7/1977 | Klauck | 330/207 P |
| 4,063,185 | 12/1977 | Kojima et al. | 330/207 P |
| 4,150,339 | 4/1979 | Sueyoshi et al. | 361/88 |
| 4,167,710 | 9/1979 | Suzuki et al. | 330/207 P |

Primary Examiner—Robert S. Tupper  
Assistant Examiner—Randall P. Myers  
Attorney, Agent, or Firm—Craig and Antonelli

[57] ABSTRACT

The output derived from an electric circuit such as an OCL type power amplifier circuit is delivered to a load such as a speaker, through a switching means such as a relay. When the operation of the electric circuit has come out of a predetermined range of operation, the switching means is operated to break the connection between the electric circuit and the load. A detection circuit for detecting the operation of the electric circuit includes a detecting transistor constructed in a semiconductor integrated circuit. The detecting transistor is connected at its base to the input terminal for external connection of the semiconductor integrated circuit, so as to receive a signal representative of the operation state of the electric circuit. The detecting transistor is so biased as to allow a predetermined electric current to flow therethrough, when the electric circuit is operating within the predetermined range of operation. However, in case of a breakdown of the detecting transistor, or when the operation of the electric circuit has come out of the predetermined range of operation, the current flowing through the detecting transistor is changed from the predetermined level. This change is transmitted to a driving transistor which is adapted to break the switching means such as a relay.

4 Claims, 4 Drawing Figures

PROTECTIVE CIRCUIT

BACKGROUND OF THE INVENTION

The present invention relates to a protective circuit such as a protective circuit for a power amplifier circuit. A load (speaker) protecting circuit of an OCL (output condenser-less) type power amplifier circuit for example, is one type of a protecting circuit for a power amplifier circuit.

This circuit is intended for preventing damage to a speaker attributable to a deviation in the level (middle point potential) of a direct current of an OCL-type power amplifier. More specifically, this protective circuit is adapted to operate switching means, such as a relay connected between the output of the power amplifier and the speaker, upon detecting that the D.C. component of the output power has exceeded a predetermined voltage level, so as to avoid damage to the speaker which would otherwise be caused by the high direct current flowing therethrough.

When this type of protective circuit is constructed as a semiconductor integrated circuit, the output D.C. level of the electric circuit is applied, through external connection input terminals of the semiconductor integrated circuit, to a detecting transistor which is incorporated in the semiconductor integrated circuit and adapted to detect the output level of the electric circuit.

According to the result of studies made by the present inventors, various high voltages, such as surge voltages and extraordinarily high voltages due to abnormal operation of the electric circuit, are often applied to the external connection input terminals of the semiconductor integrated circuit so as to cause a breakdown of the detecting transistor. These studies have also clarified that there are two modes of transistor breakdown: a burn-out mode and a short-circuiting mode.

As the detecting transistor in the semiconductor integrated circuit is broken, the switching means such as a relay connected between the electric circuit such as the OCL type power output circuit and the speaker fails to operate, so that the load such as a speaker may be damaged due to the direct current flowing therethrough.

SUMMARY OF THE INVENTION

It is therefore a major object of the invention to prevent the application of a current at an undesirable output level to the load, through operating switching means connected between the electric circuit and the load after breakdown of the detecting transistor in the protective circuit constructed as a semiconductor integrated circuit, in a case where the detecting transistor should breakdown the shortcircuiting or burn-out mode.

DESCRIPTION OF THE PREFERRED EMBODIMENTS

Figure 1:
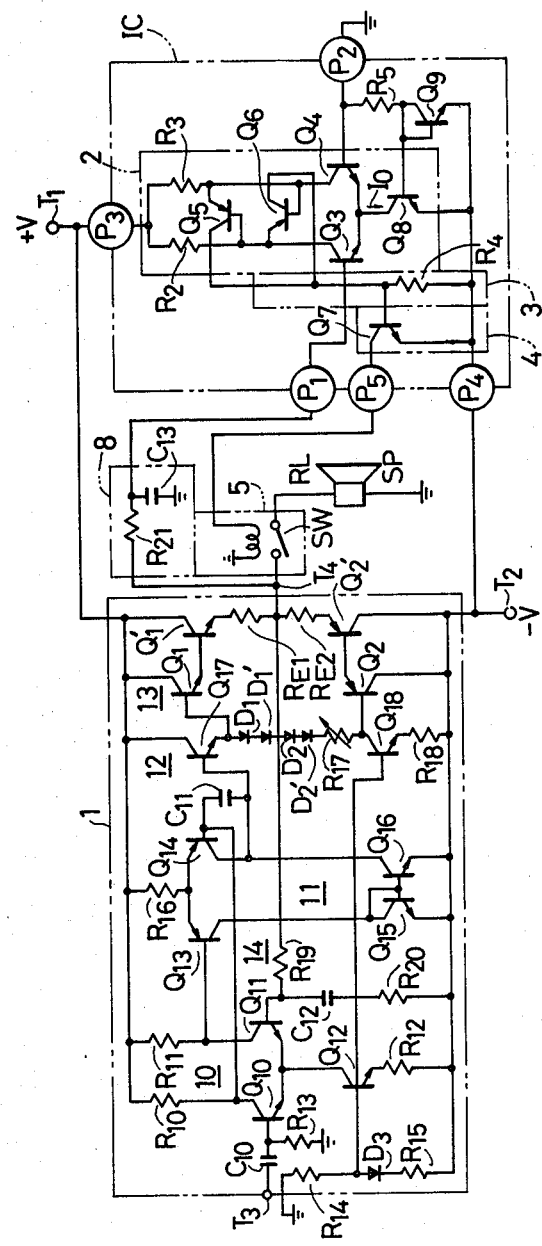
FIG. 1, FIG. 2, FIG. 3 and FIG. 4 are schematic circuit diagrams of different protective circuits constructed in accordance with the present invention.

Hereinafter, the invention will be described in more detail with reference to the accompanying drawings.

Referring to the drawings, an electric circuit 1 is an OCL type power amplifier circuit, and is adapted to be operated by an operating voltage which is constituted by a positive source voltage (+V) applied to a terminal T1 and a negative source voltage (−V) applied to a terminal T2. An input signal applied to an input terminal T3 is delivered to a first stage differential amplifier circuit 10 through a capacitor C10. The first stage differential amplifier circuit 10 is composed of NPN type transistors Q10, Q11 constituting a differential pair, NPN type transistor Q12 which functions as a constant current source, and resistors R10, R11 and R12. A ground potential is applied as a D.C. biasing voltage, through a resistor R13, to the base of transistor Q10 of the transistors constituting the differential pair.

The differential output signal from the first stage differential circuit 10 is delivered to a driving differential amplifier circuit 11 which is composed of PNP transistors Q13, Q14 constituting a differential pair, common emitter resistor R16, NPN transistors Q15 and Q16 constituting the constant current load and a phase compensating capacitor C11.

The output signal from the driving differential amplifier circuit 11 is applied to an emitter-follower circuit 12 which is composed of an emitter-follower NPN type transistor Q17, diodes D1, D1', D2, D2' and resistor R17 for adjusting the idling current, NPN type transistor Q18 functioning as a constant current circuit, and an emitter resistance R18.

The output from the emitter-follower circuit 12 is applied to a push-pull output circuit 13 which is composed of a pure complementary push-pull output circuit constituted by NPN type transistors Q1, Q1' and PNP type transistors Q2, Q2'.

The output signal derived from the output terminal T4 of the push-pull circuit is applied, through a D.C.-A.C. negative feedback circuit 14 constituted by resistors R19, R20 and a capacitor C12, to the base of the other transistor Q11 of the differential pair of the first stage differential amplifier circuit 10.

Therefore, in the normal operation of the OCL type power amplifier circuit, the output D.C. level available at the terminal T4 follows the D.C. biasing voltage (ground potential) which is applied to the base of the other transistor Q11 of the differential pair of the first stage differential amplifier circuit 10, through the negative feedback operation of the D.C.-A.C. negative feedback circuit 14. However, in case of malfunction of the OCL type power amplifier circuit, the D.C. level at the output terminal T4 is deviated either to the positive or negative side.

A detecting circuit 2 is adapted to detect the D.C. level which is derived from the output terminal T4 of the OCL power amplifier circuit T4. As shown by a broken line IC, this detecting circuit 2 is constructed by a known method in a semiconductor integrated circuit, and is constituted by a detecting NPN type transistor Q3 and a reference NPN type transistor Q4, which are connected to each other in a differential manner, load resistors R2 and R3 connected to the collectors of respective transistors Q3, Q4 of the differential pair, NPN type transistor Q8 connected commonly to the emitters of both transistors and adapted to function as a constant current circuit, and first and second PNP type switching transistors Q5,Q6 the bases of which are connected to the collectors of respective transistors Q3,Q4 of the differential pair. The base of the detecting transistor Q3 is connected to a first input terminal; P1 for the external connection of the semiconductor integrated circuit. The input terminal P1 is adapted to receive the output D.C. level available at the output terminal T4 of the OCL type power amplifier circuit 1, through a filter 8 which is constituted by a resistor R21 and a capacitor C13. The base of the reference transistor Q4 is connected to the second input terminal P2 for the external connection of the semiconductor integrated circuit. This terminal P2 is connected to a point of ground potential to compare detection of the output D.C. level.

As will be seen from broken line IC, an OR circuit 3 is also built in the semiconductor integrated circuit. The OR circuit 3 is adapted to produce at its output side a signal derived from the collectors of the first and second switching transistors Q5,Q6.

A driving circuit 4 is also constructed in the semiconductor integrated circuit, as will be seen from the broken line IC. The driving circuit 4 is constituted by a driving NPN type transistor Q7 the base of which is connected to one side of the resistor R4.

The positive source voltage (+V) is applied to a first power supply external connection terminal P3, while the negative source voltage (−V) is applied to the second power supply external connection terminal P4. The collector of the driving transistor Q7 is connected to the output terminal P5 of the semiconductor integrated circuit. This output terminal P5 is connected to one end of the coil of a relay 5. The output terminal T4 of the OCL type power amplifier circuit 1 is connected to a speaker SP through a switch SW the opening and closing of which is controlled by the energization of the coil of the relay 5.

When the output D.C. level of the output terminal T4 is within the desired range substantially at ground potential to maintain the normal operation of the OCL power amplifier circuit 1, due to the negative feedback operation of the negative feedback circuit 14 of the OCL power amplifier circuit 1, the detecting transistor Q3 and the reference transistor Q4 of the detecting circuit 2 balance each other. In this balanced state, a current Io/2 which amounts to half of the current Io in the constant current transistor Q8 is made to flow through the detecting transistor Q3 and the reference transistor Q4. When the resistance values of the load resistors R2 and R3 are equal, an equal voltage drop is caused across the load resistors R2 and R3, so that both of the first and second switching transistors Q5 and Q6 are turned off. As a result, the voltage at one end of the resistor R4 of the OR circuit becomes equal to the negative source voltage (−V). Consequently, the driving transistor Q7 of the driving circuit 4 is turned off. Due to the turning off of the driving transistor Q7, no exciting current flows through the coil of the relay 5 connected to the output terminal P5. Therefore, the contact of the switch SW is closed, so as to permit the output terminal T4 of the OCL type power amplifier circuit 1 to deliver the signal to the speaker SP.

As the output D.C. level of the output terminal T4 is deviated from the desired range which is substantially around ground potential, due to abnormal operation of the OCL type power amplifier circuit 1, this deviated D.C. level is transmitted to the first input terminal for external connection P1 through the filter 8. Thus, the current flowing through the detecting transistor Q3 is increased or decreased depending on the deviation to the positive or negative side, so that the potentials at the collectors of the detecting transistor Q3 and the reference transistor Q4 are deviated either to low and high levels, respectively, or to high level and low level, respectively. Therefore, either the first switching transistor Q5 or the second switching transistor Q6 are turned on by the deviation of the output D.C. level at the output terminal T4 to the positive or negative side. Therefore, the potential at one end of the resistor R4 of the OR circuit 3 is raised, so as to turn on the driving transistor Q7 of the driving circuit 4. As the driving transistor Q7 is turned on, an exciting current is allowed to flow through the coil of the relay 5 connected to the output terminal P5, so that the contact of the switch SW is opened to prevent the undesirable deviation of the D.C. level at the output terminal T4 of the OCL type power amplifier circuit 1 to the positive or negative side, from being delivered to the load (speaker) SP, thereby to protect the speaker Sp against damage due to the direct current.

On the other hand, the semiconductor integrated circuit including the detecting circuit 2, OR circuit 3 and the driving circuit 4 is subjected to various surge voltages or extraordinarily high voltages attributable to abnormal operation of the OCL type power amplifier circuit 1. Among the constituents of the semiconductor integrated circuit, the detecting transistor Q3 is most liable to be damaged by such surge voltages or the extraordinarily high voltage. More specifically, if the detecting transistor Q3 is a bipolar transistor, the junction between the base and emitter and the junction between the base and the collector are likely to be broken down. Two breakdown modes, i.e. the burn out mode and the short-circuiting mode may be caused between the collector and emitter by this breakdown of the junctions. In a case where the detecting transistor Q3 is a MOS type field effect transistor, the gate may be broken down to cause two modes of breakdown, i.e. burn-out mode and short-circuiting mode, between the drain and source.

According to the invention, the speaker SP is protected from burn-out attributable to an undesirable D.C. current, even when the detecting circuit 2 has become inoperative due to a breakdown resulting from a burn-out mode or short-circuiting mode of the detecting transistor Q3 which is most liable to be broken down.

More specifically, in the case of a breakdown resulting from the burn-out mode between the collector and emitter of the detecting transistor Q3, the level of the current flowing through the transistor Q3 is diminished to a very low level, so that the collector of this transistor assumes a high level, while the collector of the reference transistor Q4 attains a low level. On the other hand, in case of a breakdown resulting from the short-circuiting mode between the collector and emitter of the detecting transistor Q3, the current flowing through this transistor is drastically increased whereby the collectors of transistor Q3 and the reference transistor Q4 attain low and high levels, respectively.

Consequently, by the breakdown of the detecting transistor Q3 in the burn-out mode or short-circuiting mode, the second switching transistor Q6 or the first switching transistor Q5 is turned on, so as to turn on the driving transistor Q7 of the driving circuit 4.

As a result, an exciting current is allowed to flow through the coil of the relay 5, so that the contact of the switch SW is opened to forcibly disconnect the speaker load SP from the output terminal T4 of the power amplifier circuit 1, thereby to prevent, after the breakdown of the detecting transistor Q3, the undesirable deviation of the output D.C. level of the output terminal T4 from being applied to the speaker load SP.

Supposing here that the breakdown is caused not in the detecting transistor Q3 but in the reference transistor Q4 in the break-out or short-circuiting mode. Although this takes place seldom, the first switching transistor Q5 or the second switching transistor Q6 is turned on, so as to break the contact of the switch SW of the relay 5, in the same manner as the case of breakdown of the detecting transistor Q3.

According to the invention, there is almost no possibility of breakdown of transistors by a high voltage, in the semiconductor integrated circuit including the detecting circuit 2, OR circuit 3 and the driving circuit 4, except the detecting transistor Q3. At the same time, there is almost no fear of break-out of internal wirings in the semiconductor integrated circuit. It is therefore possible to break without fail the connection between the speaker load SP and the output terminal T4 of the OCL type power amplifier circuit 1, through the operation of the switch SW actuated by the relay 5.

The above-described embodiment of the invention is not exclusive, and various changes and modifications may be imparted thereto.

For instance, MOS type field effect transistors can be used as the detecting transistor Q3 and the reference transistor Q4, in place of the bipolar transistors. It is possible to break the connection between the speaker load SP and the output terminal T4, in case of a breakdown in the short-circuiting mode or break-out mode between the drain and source of the MOS type field effect transistor, in the same manner as the case where the bipolar transistors are used.

In the above-described embodiment, the breaking of the connection is effected through the energization of the coil of the switch means 5. Thus, the breaking operation becomes unavailable if the coil of the switching means 5 has been broken-out. In order to avoid such an inconvenience, it is preferred that the contact of the relay is a make contact which makes a contact when the coil is energized, and that the output signal from the detecting circuit 2 is inverted before it is delivered to the base of the driving transistor Q7. By such an arrangement, the connection between the OCL type power amplifier circuit 1 and the speaker load SP is maintained for the normal input, through the contact which is closed by the energization of the coil, and the connection is broken without fail, if the coil happens to be broken.

Provided that the positive source voltage +V and the negative source voltage −V are +40 V and −40 V, respectively, the detection circuit is operated with an operating voltage of 80 V. In order to reduce the operating voltage of the detecting circuit, the above high voltage is divided before it is delivered to respective terminals, by means of potential dividing resistors connected to respective terminals. When the output circuit 1 including the detecting circuit 2 is constructed as a semiconductor integrated circuit, it is necessary to utilize potential dividing resistors having high resistance values, in order to diminish the power consumed by the potential dividing circuit. For forming such high resistances in the semiconductor integrated circuit, it is necessary to preserve a large chip area. In addition, since the detection circuit 2, OR circuit 3 and the driving circuit 4 are operated by the same power supply, the driving current for driving the relay is as large as 30 mA. This current is considerably large as compared with that consumed by the detecting circuit 2 and other parts, so that it is necessary to use a specific circuit for suppressing or diminishing the influence of change of current caused in relation with the turning on and off of the relay.

Figure 2:
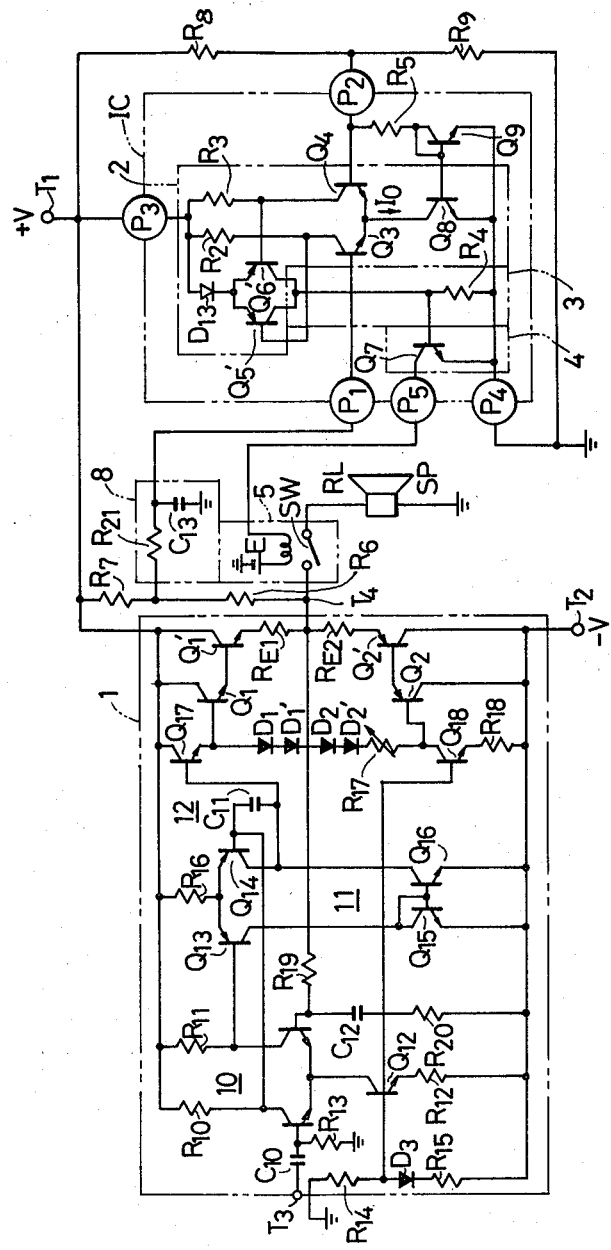

FIG. 2 shows the circuit forming another embodiment of the invention, designed and constructed to overcome the above stated problem. In this embodiment, the level of the output voltage to be detected is shifted to the positive source voltage side or to the negative source voltage side, so as to obtain a protective circuit (2,3,4) which can make use of the grounding voltage (OV) and either one of the voltage sources (+V or −V).

More specifically, as shown in FIG. 2, potential dividing resistors R6 and R7 are connected between the output terminal T4 and the positive source voltage (+V), so as to shift the level of the signal to be detected to the positive side. Meanwhile, the detecting circuit 2 is adapted to be operated with a source voltage constituted by the above-stated positive voltage +V and the grounding voltage OV. Also, the base of the reference transistor Q4 receives a base voltage through potential dividing resistors R8 and R9 corresponding to the amount of the level shift as stated above.

In this embodiment, parallel transistors adapted to receive the collector outputs from the differential-connected transistors Q3,Q4 are used as the first and the second switching transistors Q5' and Q6'. In this circuit, the constant curent IO, resistance values of resistors $R_2,R_3$ and the level shift diode $D_{13}$ provided in the emitter are selected such that the collector voltages of the transistors Q3,Q4 in the normal balanced state are the off levels of the above-mentioned output transistors Q5' and Q6'.

Figure 4:
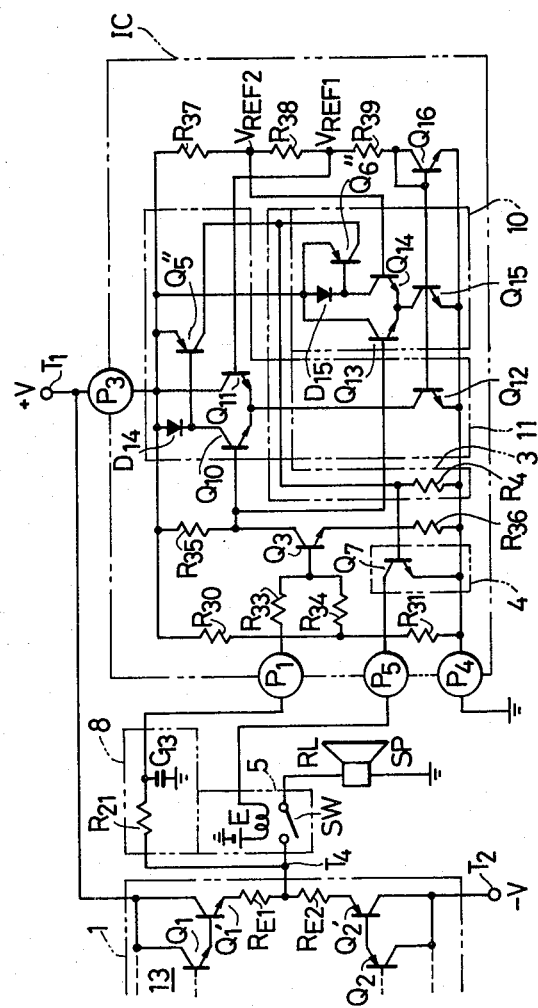

Meanwhile, the detection circuit can be modified in various ways. For instance, when the detecting transistor Q3 formed in the semiconductor integrated circuit is constructed as a single transistor which is so biased that it permits the flow of a predetermined current in the normal state of operation in which the potential of the mid point is substantially OV, as shown in FIG. 4, voltage comparison circuits, 101 and 111 for detecting the maximum and minimum values of the collector output voltage are used to detect the abnormal operation, and the driving circuit 4 is controlled by the logical sum as derived from the OR circuit 3. In this embodiment the detecting transistor Q3 has its collector connected to voltage source +V at terminal P3 via resistor R35 and its emitter connected to ground potential at terminal P4 via resistor R36. A voltage divider made up of the resistors R30 and R31 is also connected between +V and ground and the point of connection between these resistors is connected to the base of transistor Q3 via resistor R34. The external terminal P1 is connected to the base of transistor Q3 via resistor R33. The differential amplifier 11 is made up of transistors Q10 and Q11, the emitters of which are connected together to constant current transistor Q12, and differential amplifier 10 is made up of transistors Q13 and Q14, the emitters of which are connected together to constant current transistor Q15. The collectors of transistors Q10 and Q14 are connected via diodes D14 and D15, respectively, to voltage source +V at terminal P3. The output which is identical to that obtained when an extraordinary state of input is obtained, for a breakdown of the single transistor in the break-out mode and the short-circuiting mode, in case the detecting transistor Q3 is constituted by the single transistor.

Also, since the emitter potential of the driving transistor Q7 in this embodiment is the grounding potential, it is necessary to apply a predetermined voltage E to the other side of the coil of the relay 5.

In the embodiment of FIG. 4, a voltage divider made up of resistors R37, R38 and R39 is connected via transistor Q16 between voltage source +V at external terminal P3 and ground potential at external terminal P4. The point between resistors R38 and R39 represents a first voltage reference $V_{REF1}$, which is applied to the base of transistor Q11 of the differential amplifier 11. A second voltage reference $V_{REF2}$ is obtained between resistors R37 and R38 and applied to the base of transistor Q14 of the differential amplifier 10. The collector of detecting transistor Q3 is connected to the base of transistor Q10 in differential amplifier 11 and the base of transistor Q13 in differential amplifier 10, so that the detected voltage level is compared to the first and second voltage references $V_{REF1}$ and $V_{REF2}$, with the result that deviation of the detected voltage from the upper and lower voltage limits set by these reference voltages will turn on either transistor Q5" or transistor Q6" to operate the switch SW of the relay 5 in the manner already described.

The detecting circuit as used in the protective circuit of the invention is not limited to the described detection of output D.C. level of the OCL type power amplifier circuit. Rather, the protective circuit of the invention can be used for breaking the connection between the load and the electric circuit, upon detection of deviations of circuit operations of various electric circuits from the predetermined ranges.

Figure 3:
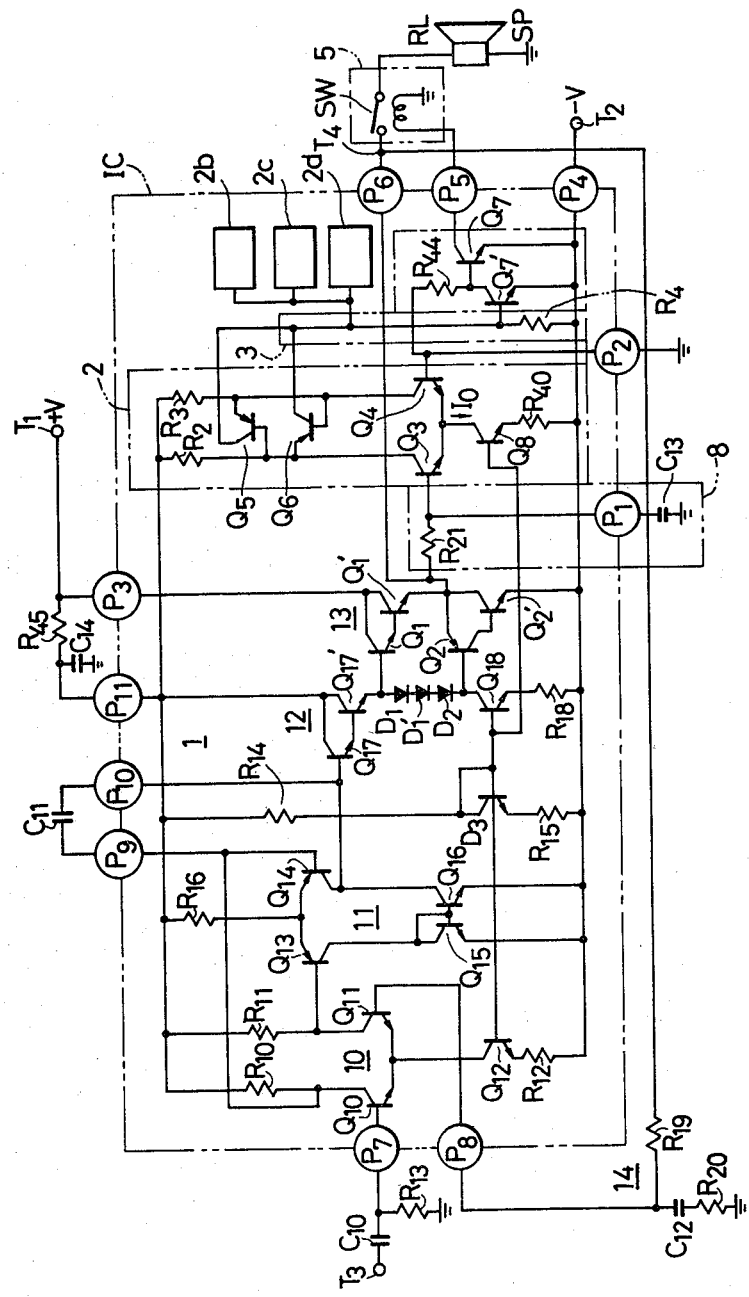

FIG. 3 shows a breaking circuit constructed in accordance with another embodiment of the invention similar to that of FIG. 1. An OCL type power amplifier circuit 1, detection circuit 2 for detecting the output D.C. level, OR circuit 3 and a driving circuit 4 are constructed in a semiconductor integrated circuit as enclosed by the broken line IC.

The semiconductor integrated circuit further includes a detection circuit 2b adapted for detecting a temperature rise of the power transistors in the integrated circuit above a predetermined temperature, detection circuit 2c for detecting the closing of power supply (+V, −V) or change of the source voltage, and a detection circuit 2d for detecting an overcurrent caused by short-circuiting of the load or the like reason. In case that a speaker load having a resistance considerably smaller than a predetermined resistance value RL is connected as the speaker load SP, considerably large currents flow through the power transistors Q1,Q1',Q2 and Q2' of the push-pull output circuit 13. Due to this increment of the current, the junction temperatures of these transistors are raised, resulting, in some cases, in breakdown of these transistors due to thermal runaway.

On the other hand, an extraordinary transient response is often caused in the output terminal T4 of the OCL type power amplifier circuit, immediately after the closing of the power supply circuit. Further, overcurrents may flow through the power transistors Q1', Q2 and Q2' in the push-pull circuit 13, resulting in the breakdown of these power transistors, due to a short-circuiting in the speaker load SP or the like reason.

According to this embodiment, it is possible to form a wired OR by a direct connection of outputs of the detection circuits 2,2b,2c and 2d, adapted for detecting various circuit operations coming out of respective predetermined ranges, to the input of driving circuit 4 so as to afford a simplified construction of the circuit as a whole and a safe protective operation.

In this embodiment, the temperature rise of the output power transistor can be achieved by making use of the temperature-dependency of the voltage between base and emitter of a temperature detecting transistor which is disposed in a chip of a monolithic IC in the close proximity of the power transistor. Also, the short-circuiting in the load can be detected through the measurement of the load current. In the circuit of this embodiment, the arrangement is such that, as stated before, a transistor Q7' for inversion is connected to the input side of the driving transistor Q7, so as to turn on the latter Q7 by normal input to make the same Q7 allow the energization of the coil of relay 5, thereby to turn on the switch SW, and to turn off the driving transistor 7 in case of an extraordinary operation of the circuit, so as to cut the exciting current to turn the switch SW off, thereby to protect the speaker (load) or the push-pull circuit.

What is claimed is:
1. A protective circuit for an electric circuit adapted to drive a load comprising: switching means normally connecting the output of said electric circuit to said load, detection circuit means connected to said electric circuit for detecting an electrical characteristic indicating the state of operation of said electric circuit, and means including a driving transistor controlled by the output from said detection circuit means for controlling said switching means to open the connection to said load from said electric circuit when the operation of said electric circuit results in deviation of said electrical characteristic from a predetermined range, said detection circuit means including a detecting transistor constructed in a semiconductor integrated circuit, said detecting transistor having a first input electrode connected to receive a signal representative of said electrical characteristic of said electric circuit through an input terminal for external connection to said semiconductor integrated circuit, means for biasing said detecting transistor so as to allow a predetermined electric current to flow therethrough when the electrical characteristic of said electric circuit falls within said predetermined range, a reference transistor connected in a differential manner to said detecting transistor, said reference transistor having a first input electrode connected to receive a reference level corresponding to the level of said signal applied to said detecting transistor when the electrical characteristic of said electric circuit falls within said predetermined range, and first and second switching transistors having respective first input electrodes connected to the output electrodes of said detecting transistor and said reference transistor, in such a manner that either one of said first and second switching transistors is turned on when said output electrodes of said detecting and reference transistors take a low level and a high level, respectively, or, alternatively, when said output electrodes of said detecting and reference transistors take a high level and a low level, respectively, the output signals derived from said output electrodes of said first and second switching transistors being applied to a first input terminal of said driving transistor so that the output of said detecting transistor is applied to drive said driving transistor, by a change in said predetermined electric current caused by a change in said signal received by said first input electrode or a breakdown of said detecting transistor itself, so as to cause said driving transistor to control said switching means to open the connection to said load from said electric circuit.

2. A protective circuit as claimed in claim 1, wherein said electric circuit is an output condenser-less type power output circuit, while said load means is a speaker, the output from said power output circuit being delivered in the form of a D.C. current to said speaker.

3. A protective circuit for an electric circuit adapted to drive a load comprising: switching means normally connecting the output of said electric circuit to said load, detection circuit means connected to said electric circuit for detecting an electrical characteristic indicating the state of operation of said electric circuit, and means including a driving transistor controlled by the output from said detection circuit means for controlling said switching means to open the connection to said load from said electric circuit when the operation of said electric circuit results in deviation of said electrical characteristic from a predetermined range, said detection circuit means including a detecting transistor constructed in a semiconductor integrated circuit, said detecting transistor having a first input electrode connected to receive a signal representative of said electrical characteristic of said electric circuit through an input terminal for external connection to said semiconductor integrated circuit, means for biasing said detecting transistor so as to allow a predetermined electric current to flow therethrough when the electrical characteristic of said electric circuit falls within said predetermined range, reference means for providing first and second reference voltage levels representing the upper and lower limits of said predetermined range, first and second differential amplifiers connected to receive the output of said detecting transistor and a respective one of said first and second reference voltages, and means connecting the outputs of said first and second differential amplifiers to said driving transistor so that the output of said detecting transistor is applied to drive said driving transistor, by a change in said predetermined electric current caused by a change in said signal received by said first input electrode or a breakdown of said detecting transistor itself, so as to cause said driving transistor to control said switching means to open the connection to said load from said electric circuit.

4. A protective circuit as defined in claim 5, wherein said connecting means for said driving transistor comprises first and second switching transistors having respective first input electrodes connected to the outputs of said first and second differential amplifiers, respectively, in such a manner that either one of said first and second switching transistors is turned on when an output is received from the differential amplifier connected thereto and means for connecting the outputs of said first and second switching transistors in common to said driving transistor.

* * * * *